(12) United States Patent
Farshchian et al.

(10) Patent No.: US 11,622,474 B2
(45) Date of Patent: Apr. 4, 2023

(54) COOLING ELECTRONIC DEVICES IN A DATA CENTER

(71) Applicant: Google LLC, Mountain View, CA (US)

(72) Inventors: Soheil Farshchian, San Jose, CA (US); Kenneth Dale Shaul, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/835,487

(22) Filed: Jun. 8, 2022

(65) Prior Publication Data

US 2022/0304195 A1 Sep. 22, 2022

Related U.S. Application Data

(62) Division of application No. 16/575,953, filed on Sep. 19, 2019, now Pat. No. 11,419,246, which is a
(Continued)

(51) Int. Cl.
*F28D 15/02* (2006.01)
*H05K 7/20* (2006.01)
(Continued)

(52) U.S. Cl.
CPC ......... *H05K 7/20818* (2013.01); *F28D 15/02* (2013.01); *F28D 15/0233* (2013.01);
(Continued)

(58) Field of Classification Search
CPC .. F28D 15/02; F28D 15/0233; F28D 15/0266; F28D 15/0275; H01L 23/473; H01L 23/4735; H05K 7/20818
See application file for complete search history.

(56) References Cited

U.S. PATENT DOCUMENTS 4,777,561 A 10/1988 Murphy et al.
4,884,168 A 11/1989 August et al.
(Continued)

FOREIGN PATENT DOCUMENTS

CN 101040162 9/2007
CN 102835198 A 12/2012
(Continued)

OTHER PUBLICATIONS

Andie Hioki, "The Cray-1 Supercomputer" San Jose State University, 2002, retrieved on Sep. 8, 2010 from http://www.openloop.com/education/classes/sjsu_engr/engr_compOrg/spring2002/studentProjects/Andie_Hioki/CraylwithAdd.htm, 16 pages.
(Continued)

*Primary Examiner* — Nael N Babaa
(74) *Attorney, Agent, or Firm* — Fish & Richardson P.C.

(57) ABSTRACT

A thermosiphon includes a condenser; an evaporator that includes a fluid channel and a heat transfer surface, the heat transfer surface defining a plurality of fluid pathways in the fluid channel that extend through the fluid channel, the evaporator configured to thermally couple to one or more heat-generating electronic devices; and a transport member that fluidly couples the condenser and the evaporator, the transport member including a liquid conduit that extends through the transport member to deliver a liquid phase of a working fluid into the fluid pathways, the transport member further including a surface to vertically enclose the plurality of fluid pathways.

33 Claims, 15 Drawing Sheets

Related U.S. Application Data division of application No. 14/747,448, filed on Jun. 23, 2015, now Pat. No. 10,462,935.

(51) Int. Cl.
  *H01L 23/473* (2006.01)
  *G06F 1/20* (2006.01)

(52) U.S. Cl.
  CPC ..... *F28D 15/0266* (2013.01); *F28D 15/0275* (2013.01); *G06F 1/20* (2013.01); *H01L 23/473* (2013.01); *H01L 23/4735* (2013.01); *H05K 7/20809* (2013.01); *G06F 2200/201* (2013.01)

(56) References Cited

U.S. PATENT DOCUMENTS

| | | |
|---|---|---|
| 5,768,104 A | 6/1998 | Salmonson et al. |
| 5,907,475 A | 5/1999 | Babinski et al. |
| 5,998,863 A | 12/1999 | Kobayashi et al. |
| 6,005,772 A | 12/1999 | Terao et al. |
| 6,151,215 A | 11/2000 | Hoffman |
| 6,477,847 B1 | 11/2002 | Bonaquist et al. |
| 6,549,408 B2 | 4/2003 | Berchowitz |
| 6,550,255 B2 | 4/2003 | Rudick et al. |
| 6,657,121 B2 | 12/2003 | Garner |
| 6,714,413 B1 | 3/2004 | Ghosh et al. |
| 6,775,137 B2 | 8/2004 | Chu et al. |
| 6,804,117 B2 | 10/2004 | Phillips et al. |
| 6,889,756 B1 | 5/2005 | Hou |
| 6,910,637 B2 | 6/2005 | Hsieh et al. |
| 6,924,981 B2 | 8/2005 | Chu et al. |
| 6,972,365 B2 | 12/2005 | Garner |
| 7,025,129 B2 | 4/2006 | Chiu |
| 7,130,191 B2 | 10/2006 | Lin et al. |
| 7,231,961 B2 | 6/2007 | Alex et al. |
| 7,309,911 B2 | 12/2007 | Bartley et al. |
| 7,318,322 B2 | 1/2008 | Ota et al. |
| 7,397,662 B2 | 7/2008 | Oyamada |
| 7,403,384 B2 | 7/2008 | Pflueger |
| 7,564,685 B2 | 7/2009 | Clidaras et al. |
| 7,599,184 B2 | 10/2009 | Upadhya et al. |
| 7,701,714 B2 | 4/2010 | Shabany |
| 7,719,837 B2 | 5/2010 | Wu |
| 7,958,935 B2 | 6/2011 | Belits et al. |
| 8,031,464 B2 | 10/2011 | Adkins et al. |
| 8,077,463 B2 | 12/2011 | Lee |
| 8,130,497 B2 | 3/2012 | Kondo et al. |
| 8,164,902 B2 | 4/2012 | Matsushima et al. |
| 8,644,020 B2 | 2/2014 | Lau et al. |
| 8,773,854 B2 | 7/2014 | Rice et al. |
| 2002/0029873 A1 | 3/2002 | Sugito et al. |
| 2002/0053726 A1 | 5/2002 | Mikubo et al. |
| 2003/0128508 A1 | 7/2003 | Faneuf et al. |
| 2003/0128516 A1 | 7/2003 | Faneuf et al. |
| 2003/0151896 A1 | 8/2003 | Zeighanni et al. |
| 2004/0225816 A1 | 11/2004 | Leigh et al. |
| 2005/0217829 A1 | 10/2005 | Belits et al. |
| 2006/0005980 A1 | 1/2006 | Gamer |
| 2006/0196640 A1 | 9/2006 | Siu |
| 2007/0042514 A1 | 2/2007 | Wu et al. |
| 2007/0209782 A1 | 9/2007 | Wyatt et al. |
| 2007/0263355 A1 | 11/2007 | Yu et al. |
| 2008/0013283 A1 | 1/2008 | Gilbert et al. |
| 2008/0043442 A1 | 2/2008 | Strickland et al. |
| 2008/0055848 A1 | 3/2008 | Hamburgen et al. |
| 2009/0021908 A1 | 1/2009 | Patel et al. |
| 2009/0027856 A1 | 1/2009 | McCoy |
| 2009/0260783 A1 | 10/2009 | Suzuki et al. |
| 2009/0284924 A1 | 11/2009 | Konshak et al. |
| 2010/0032142 A1 | 2/2010 | Copeland et al. |
| 2010/0073863 A1 | 3/2010 | Matsushima et al. |
| 2010/0107658 A1 | 5/2010 | Cockrell |
| 2011/0182033 A1 | 7/2011 | Tissot et al. |
| 2012/0024499 A1 | 2/2012 | Chang et al. |
| 2012/0175094 A1 | 7/2012 | Rice |
| 2013/0213075 A1 | 8/2013 | Bilski |
| 2014/0014303 A1 | 1/2014 | Rice et al. |
| 2014/0146466 A1 | 5/2014 | Lau et al. |
| 2016/0054073 A1 | 2/2016 | Rice |

FOREIGN PATENT DOCUMENTS

| | | |
|---|---|---|
| CN | 103430644 A | 12/2013 |
| DE | 20-2013-012-533 | 5/2017 |
| EP | 1669710 | 6/2006 |
| EP | 2170030 | 3/2010 |
| JP | 2011227829 | 11/2011 |
| TW | 201414145 | 4/2014 |
| WO | WO 2002077547 | 10/2002 |
| WO | WO 2007012108 | 2/2007 |
| WO | WO 2012/028144 | 3/2012 |
| WO | WO 2012164261 | 12/2012 |
| WO | WO 2015048973 | 4/2015 |

OTHER PUBLICATIONS

Austin Modine, "Remembering the CRAY-1 When Computers and Furniture Collide" The Register, Jan. 5, 2008, retrieved on Sep. 8, 2010 from http://www.theregister.co.uk/2008/01/05/tob_cray1/print.html, 7 pages.

CN Office Action in Chinese Application No. 201680025204, dated Jan. 17, 2020, 5 pages (with English translation).

CN Office Action issued in Chinese Application No. 201680025204.8, dated Feb. 27, 2019, 26 pages (with English translation).

CoolIT Systems, "Rack DCLC—Product Guide," 2009, 8 pages.

DE Office Action in DE Application No. 112016002855.5, dated Dec. 9, 2021, 19 pages (with English translation).

GB Office Action in Appln. No. GB 1717592.8, dated Oct. 16, 2020, 4 pages.

GB Office Action in Great Britain Application No. GB1717592.8, dated May 21, 2020, 4 pages.

GB Office Action in Great Britain Application No. GB1717592.8, dated Mar. 29, 2021, 5 pages.

International Preliminary Report on Patentability issued in International Application No. PCT/US2016/034085, dated Jan. 4, 2018, 7 pages.

International Search Report and Written Opinion in International Application No. PCT/US2016/034085, dated Aug. 30, 2016, 10 pages.

James S. Kolodzey, "CRAY-1 Computer Technology" IEEE Transactions on Components, Hybrids, and Manufacturing Technology, vol. CHMT-4, No. 2, Jun. 1981, pp. 181-186.

Jeremy Rice et al., U.S. Appl. No. 14/137,258, filed Dec. 20, 2013, 42 pages.

Office Action issued in Taiwanese Application No. 105119601, dated Aug. 14, 2017, 7 pages (English Translation).

Richard M. Russell, "The CRAY-1 Computer System" Communications of the ACM, vol. 21, No. 1, Jan. 1978, pp. 63-72.

TW Office Action in Taiwanese Application No. 107122844, dated Mar. 30, 2020, 14 pages (with English translation).

COOLING ELECTRONIC DEVICES IN A DATA CENTER

CROSS-REFERENCE TO RELATED APPLICATIONS

This application is a divisional of, and claims priority under 35 U.S.C. § 120 to, U.S. patent application Ser. No. 16/575,953, filed on Sep. 19, 2019, which is a divisional of, and claims priority under 35 U.S.C. § 120 to, U.S. patent application Ser. No. 14/747,448, filed on Jun. 23, 2015, now U.S. Pat. No. 10,462,935, the entire contents of which are incorporated by reference herein.

TECHNICAL FIELD

This document relates to systems and methods for providing cooling to electronic equipment, such as computer server racks and related equipment in computer data centers, with a thermosiphon.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

This disclosure describes a thermosiphon system that may be used to cool one or more heat generating devices mounted in a rack of a computer data center (e.g., on a motherboard, server board, or otherwise). The thermosiphon system, is some example implementations, includes a condenser and a flow boiling evaporator that are fluidly coupled together with a conduit. In some aspects, the flow boiling evaporator includes one or more fluid paths through which a liquid phase of a working fluid flows as it receives heat from the one or more heat generating devices and changes to a vapor or mixed (liquid and vapor) phase.

In an example general implementation, a thermosiphon includes a condenser; an evaporator that includes a fluid channel and a heat transfer surface, the heat transfer surface defining a plurality of fluid pathways in the fluid channel that extend through the fluid channel, the evaporator configured to thermally couple to one or more heat-generating electronic devices; and a transport member that fluidly couples the condenser and the evaporator, the transport member including a liquid conduit that extends through the transport member to deliver a liquid phase of a working fluid into the fluid pathways, the transport member further including a surface to vertically enclose the plurality of fluid pathways.

In a first aspect combinable with the general implementation, the fluid channel is oriented transverse to the fluid pathways.

In a second aspect combinable with any of the previous aspects, the transport member further includes a vapor conduit that extends through the transport member to receive a mixed-phase of the working fluid from the fluid pathways.

In a third aspect combinable with any of the previous aspects, the fluid pathways are configured to transfer heat from the heat-generating electronic devices to the working fluid to change the working fluid from the liquid phase to the mixed-phase between inlets of the fluid pathways and outlets of the fluid pathways.

In a fourth aspect combinable with any of the previous aspects, the inlets of the fluid pathways are positioned at a first end of the fluid pathways and the outlets of the fluid pathways are positioned at a second end of the fluid pathways opposite the first end.

In a fifth aspect combinable with any of the previous aspects, the inlets of the fluid pathways are positioned at a midpoint of the fluid pathways, and the outlets of the fluid pathways are positioned at opposed ends of the fluid pathways.

In a sixth aspect combinable with any of the previous aspects, the heat transfer surface includes a plurality of fins or ridges, and the plurality of fins or ridges form the plurality of fluid pathways in the fluid channel, and the plurality of fluid pathways extend transverse to the fluid channel.

In a seventh aspect combinable with any of the previous aspects, the heat transfer surface includes a plurality of fins or ridges, and the plurality of fins or ridges form the plurality of fluid pathways in the fluid channel, and the plurality of fluid pathways extend parallel with the fluid channel.

In an eighth aspect combinable with any of the previous aspects, the transport member further includes a heat transfer interface between the liquid conduit and the vapor conduit to transfer heat from the working fluid in the vapor conduit to the working fluid in the liquid conduit.

In a ninth aspect combinable with any of the previous aspects, the liquid phase is at or near a saturation temperature of the working fluid.

In a tenth aspect combinable with any of the previous aspects, the vapor conduit includes at least two vapor conduits.

In an eleventh aspect combinable with any of the previous aspects, at least a portion of the vapor conduit is positioned in an upper half of the transport member, and at least a portion of the liquid conduit is positioned in a lower half of the transport member.

In a twelfth aspect combinable with any of the previous aspects, the transport member includes a condenser end that includes an inlet of the liquid conduit that is offset in the transport member relative to an outlet of the vapor conduit in the condenser end of the transport member.

In a thirteenth aspect combinable with any of the previous aspects, a cross sectional area of the liquid conduit and a cross-sectional area of the vapor conduit is based, at least in part, on a heat load of the heat-generating electronic devices.

In a fourteenth aspect combinable with any of the previous aspects, the transport member slopes from the condenser to the evaporator, and a magnitude of the slope defines, at least in part, a liquid head of the working fluid.

In a fifteenth aspect combinable with any of the previous aspects, the liquid head of the working fluid is equal to a sum of a plurality of pressure losses in a closed loop fluid circuit that includes the liquid conduit, the evaporator, the vapor conduit, and the condenser.

A sixteenth aspect combinable with any of the previous aspects further includes a spacer positioned in the fluid channel.

In another example general implementation, a method for cooling heat generating electronic devices in a data center includes flowing a liquid phase of a working fluid from a condenser of a thermosiphon to an evaporator of the thermosiphon in a transport member of the thermosiphon; flowing the liquid phase of the working fluid into a fluid channel of the evaporator from the transport member; flowing the liquid phase of the working fluid from the fluid channel to a plurality of fluid pathways that extend through the fluid channel and are enclosed between the evaporator and the transport member; boiling at least a portion of the liquid working fluid flowing in the plurality of fluid pathways based on a transfer of heat from at least one data center heat generating device that is thermally coupled to the evaporator; and flowing a mixed phase of the working fluid out of the plurality of fluid pathways into at least one vapor conduit of the transport member and to the condenser.

A first aspect combinable with the general implementation further includes transferring heat from the heat-generating electronic devices to the working fluid through a heat transfer surface that forms the plurality of fluid pathways; and changing the working fluid from the liquid phase to the mixed-phase between inlets of the fluid pathways and outlets of the fluid pathways.

A second aspect combinable with any of the previous aspects further includes flowing the liquid phase into the inlets of the fluid pathways positioned at a first end of the fluid pathways; and flowing the mixed phase out of the outlets of the fluid pathways positioned at a second end of the fluid pathways opposite the first end.

A third aspect combinable with any of the previous aspects further includes flowing the liquid phase into the inlets of the fluid pathways positioned at a midpoint of the fluid pathways; and flowing the mixed phase out of the outlets of the fluid pathways positioned at opposed ends of the fluid pathways.

A fourth aspect combinable with any of the previous aspects further includes flowing the working fluid through a plurality of fins or ridges positioned that form the plurality of fluid pathways in the fluid channel.

In a fifth aspect combinable with any of the previous aspects, flowing the working fluid through a plurality of fins or ridges that form the plurality of fluid pathways in the fluid channel includes flowing the working fluid transversely from the fluid channel through the plurality of fluid pathways.

A sixth aspect combinable with any of the previous aspects further includes transferring heat from the working fluid in the vapor conduit to the working fluid in the liquid conduit through a heat transfer interface between the liquid conduit and the vapor conduit in the transport member.

In a seventh aspect combinable with any of the previous aspects, the liquid phase is at or near a saturation temperature of the working fluid.

An eighth aspect combinable with any of the previous aspects further includes flowing the mixed phase of the working fluid through the at least one vapor conduit to the condenser.

In another example general implementation, a data center cooling system includes a tray sub-assembly configured to engage with a rack; a support board mounted on the tray sub-assembly, the support board including a heat-generating computing device; and a thermosiphon system. The thermosiphon system includes a condenser; a flow boiling evaporator that includes at least one fluid pathway configured to receive a flow of a working fluid in liquid phase and output the flow of the working fluid in a mixed liquid-vapor phase based on heat transferred from the heat-generating computing device to the flow of the working fluid; and a transport tubular that fluidly couples the condenser and the evaporator.

In a first aspect combinable with the general implementation, the evaporator includes a fluid channel and a plurality of fluid pathways that extend through the fluid channel.

In a second aspect combinable with any of the previous aspects, the transport tubular includes a liquid carrier that extends through the transport tubular and is oriented transverse to the fluid pathways to deliver the flow of the working fluid in liquid phase into the fluid pathways; and a vapor carrier that extends through the transport tubular to receive the flow of the working fluid in mixed liquid-vapor phase from the fluid pathways.

In a third aspect combinable with any of the previous aspects, the plurality of fluid pathways are defined between a plurality of heat transfer surfaces.

In a fourth aspect combinable with any of the previous aspects, inlets of the plurality fluid pathways are positioned at a first end of the fluid pathways and outlets of the plurality of fluid pathways are positioned at a second end of the fluid pathways opposite the first end.

In a fifth aspect combinable with any of the previous aspects, inlets of the plurality of fluid pathways are positioned near or at a midpoint of the fluid pathways, and outlets of the plurality of fluid pathways are positioned at opposed ends of the fluid pathways.

Various implementations of a data center cooling system according to the present disclosure may include one, some, or all of the following features. For example, a thermosiphon assembly of the data center cooling system may provide for increased thermal performance by removing more heat from heat-generating electronic devices as compared to conventional, pool boiling thermosiphons. As another example, the thermosiphon assembly may better match a particular thermal load of a heat-generating electronic device, thereby providing a more accurate amount of cooling without being over or undersized. As yet another example, the thermosiphon assembly may be flow balanced as compared to conventional thermosiphons, thereby more efficiently circulating a working fluid through the assembly.

The details of one or more embodiments are set forth in the accompanying drawings and the description below. Other features, objects, and advantages will be apparent from the description and drawings, and from the claims.

DETAILED DESCRIPTION

Figure 1:
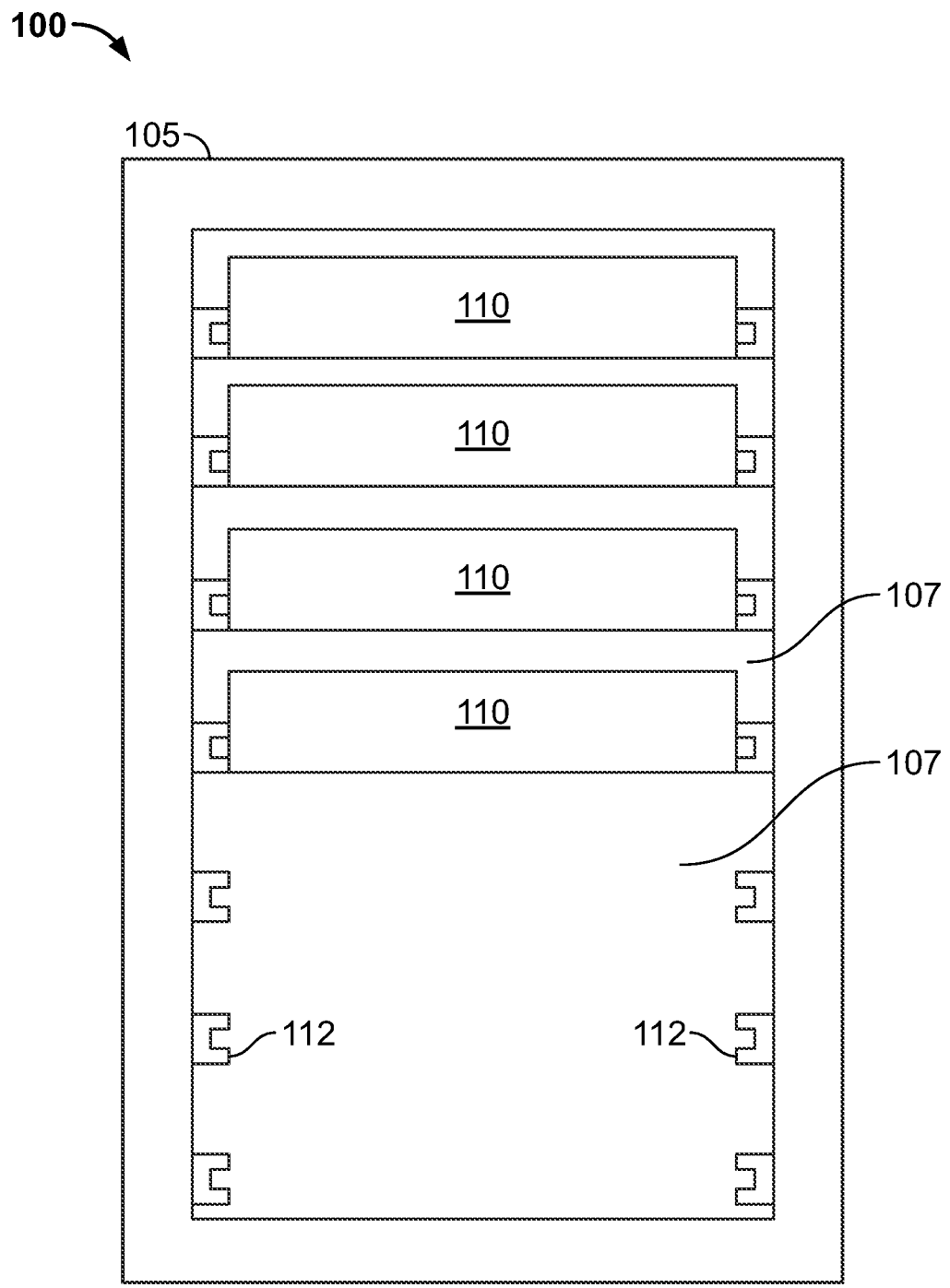
FIG. 1 illustrates a front view of a server rack and a server-rack sub-assembly configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2A:
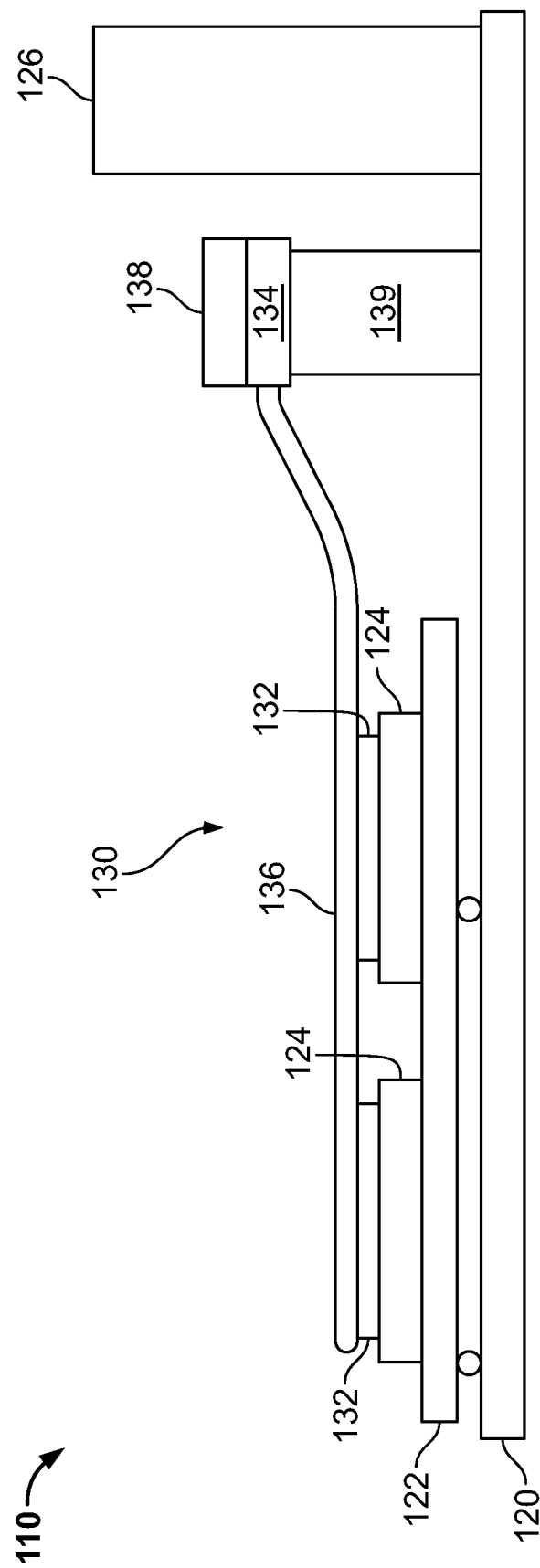
FIGS. 2A-2B illustrate schematic side and top views, respectively, of a server rack sub-assembly that includes an example implementation of a thermosiphon cooling system.
Figure 2B:
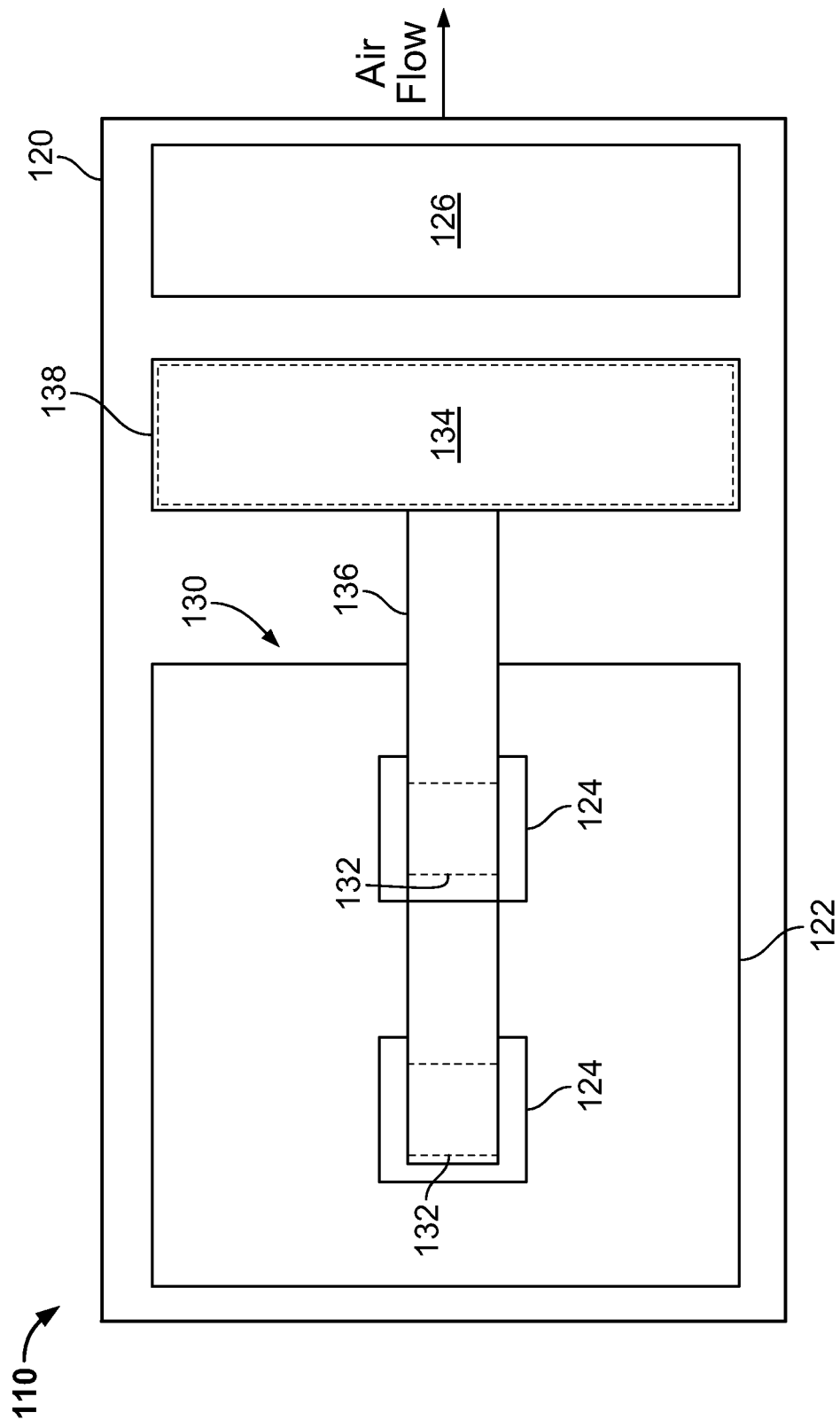

Referring to FIGS. 2A-2B, the server rack sub-assembly 110 includes a frame or cage 120, a printed circuit board 122, e.g., motherboard, supported on the frame 120, one or more heat-generating electronic devices 124, e.g., a processor or memory, mounted on the printed circuit board 122, and a thermosiphon system 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2A-2B illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2A illustrates the frame 120 as a flat plate, the frame 120 can include one or more side walls that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIGS. 2A-2B) of the server rack sub-assembly 110, closer to the front of the rack 105 when the sub-assembly 110 is installed in the rack 105, flows (as illustrated) over the motherboard 122, over some of the heat generating components on the motherboard 122, and is exhausted from the server rack assembly 110 at the back edge (at the right hand side), closer to the back of the rack 105 when the sub-assembly 110 is installed in the rack 105. The one or more fans 126 can be secured to the frame 120 by brackets. Thus, the fans 126 can pull air from within the frame 120 area and push the air after it has been warmed out the rack 105. An underside of the motherboard 122 can be separated from the frame 120 by a gap.

The thermosiphon system 130 includes an evaporator 132, a condenser 134 mounted on a base 139, and a transport member 136 connecting the evaporator 132 to the condenser 134. The evaporator 132 contacts the electronic device 124 so that heat is drawn by conductive heat transfer from the electronic device 124 to the evaporator 132. For example, the evaporator 132 is in conductive thermal contact with the electronic device 124. In particular, the bottom of the evaporator 132 contacts the top of the electronic device 124. In operation, heat from the electronic device 124 causes a working fluid in the evaporator 132 to evaporate. The vapor then passes through transport member 136 to the condenser 134. Heat is radiated away from the condenser 134, e.g., into air around the condenser 134 or into air blown or drawn by the one or more fans 126 that passes across the condenser 134, a heat transfer surface 148 (e.g., finned surface), or both, causing the working fluid to condense. As shown in FIG. 2A, the condenser 134 can be located between the one or more fans 126 from the evaporator 132, but could also be located on an opposite side of one or more of fans 126 (e.g., near an edge of the sub-assembly 110).

As shown in FIG. 2A, the transport member 136 is at a slight (non-zero) angle so that gravity causes the condensed working fluid to flow back through the transport member 136 to the evaporator 132. Thus, in some implementations, at least a portion of the transport member 136 is not parallel to the main surface of the frame 120. For example, the condenser-side end of the transport member 136 can be about 1-5 mm, e.g., 2 mm, above the evaporator-side end of the transport member 136. However, it is also possible for the transport member 136 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 2A, there is a first evaporator 132 and a second evaporator 132 as well as a first electronic device 124 and a second electronic device 124. The transport member 136 connecting the first evaporator to the second evaporator can be level.

During operation, the top surface of the working fluid (as a liquid) inside the condenser 134 will be above the top surface liquid height of the working fluid in the evaporator 132, e.g., by 1 to 10 mm. It can be easier to achieve this with a transport member 136 that is at a slight (positive non-zero) angle, but proper selection of the thermal and mechanical properties of the working fluid in view of the expected heat transport requirements for the thermosiphon system 130 may still achieve this for a transport member 136 that is horizontal or at a slightly negative angle. During operation, the liquid phase of a working fluid can flow through a liquid conduit of the transport member 136, and a vapor phase (or mixed vapor-liquid phase) of the working fluid can flow through a vapor conduit of the transport member 136.

FIGS. 2A-2B illustrate a thermosiphon system 130 with multiple evaporators 132; each evaporator 132 can contact a different electronic device 124, or multiple evaporators 132 could contact the same electronic device, e.g., if the electronic device is particularly large or has multiple heat generating regions. The multiple evaporators 132 can be connected by the transport member 136 to the condenser 134 in series, e.g., a single transport member 136 connects the condenser 134 to a first evaporator 132 and a second evaporator 132. Alternatively, some or all of the multiple evaporators 132 can be connected by multiple transport members 136 to the condenser 134 in parallel, e.g., a first transport member connects the condenser to a first evaporator, and a second transport member connects the condenser 134 to a second evaporator. Advantages of a serial implementation may be fewer tubes, whereas an advantage of parallel tubes is that the tube diameters can be smaller.

FIGS. 2A-2B illustrate a thermosiphon system 130 in which a common transport member 136 is used for both the condensate flow from the condenser 134 to the evaporator 132 and for vapor (or mixed phase) flow from the evaporator 132 to the condenser 134. Thus, in this implementation the fluid coupling between the evaporator 132 and the condenser 134 consists of a combined condensate and vapor transfer line 136. A potential advantage of the combined condensate and vapor transfer line is that the transport member 136 can be connected to a side of the condenser, reducing the vertical height of the system relative to a system with a separate line for the vapor, since the vapor line is typically coupled to or near the top of the evaporator. The transport member 136 can be a flexible tube or pipe, e.g., of copper or aluminum.

Figure 3A:
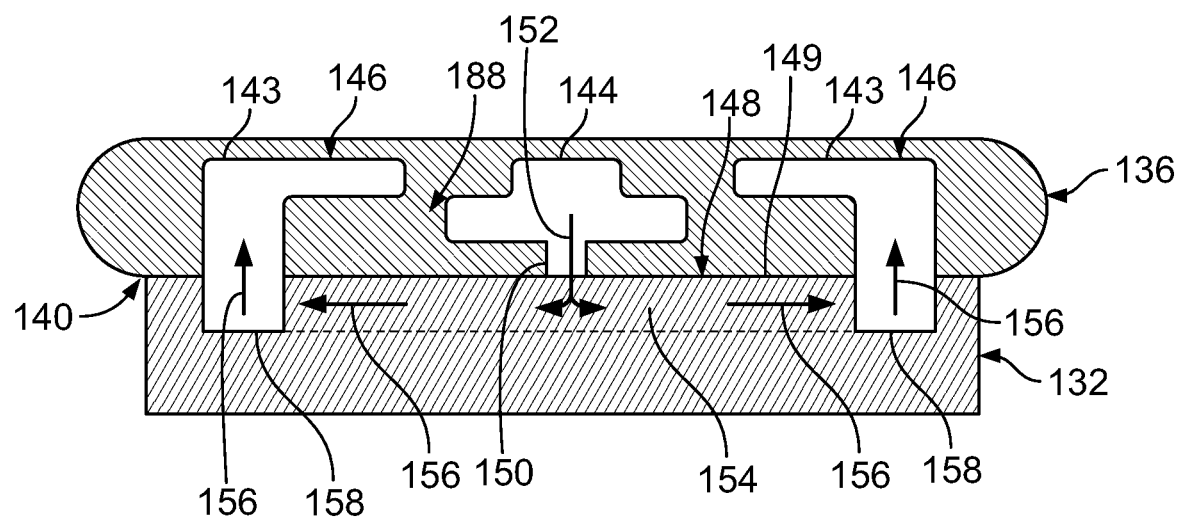
FIGS. 3A-3C illustrate schematic cross-sectional end, isometric, and top views, respectively, of an evaporator of an example implementation of a thermosiphon cooling system.
Figure 3B:
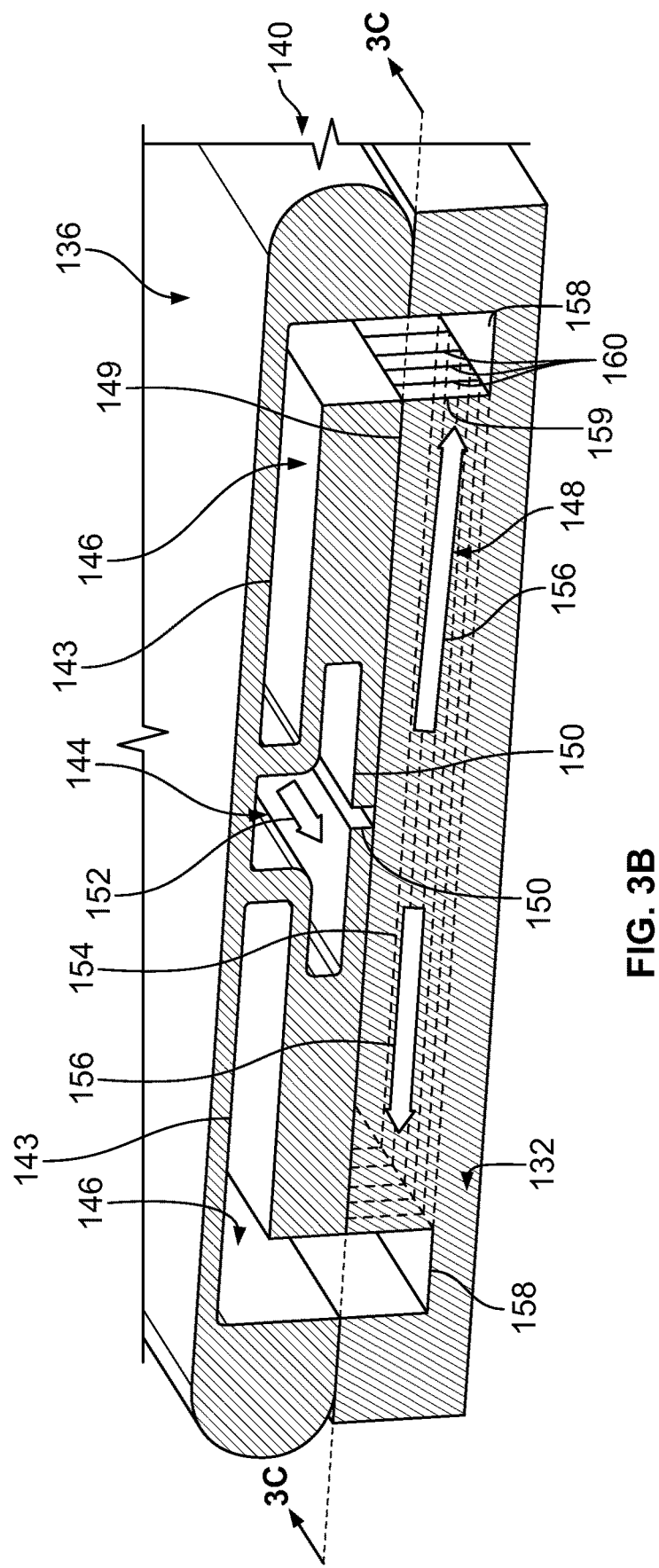
Figure 3C:
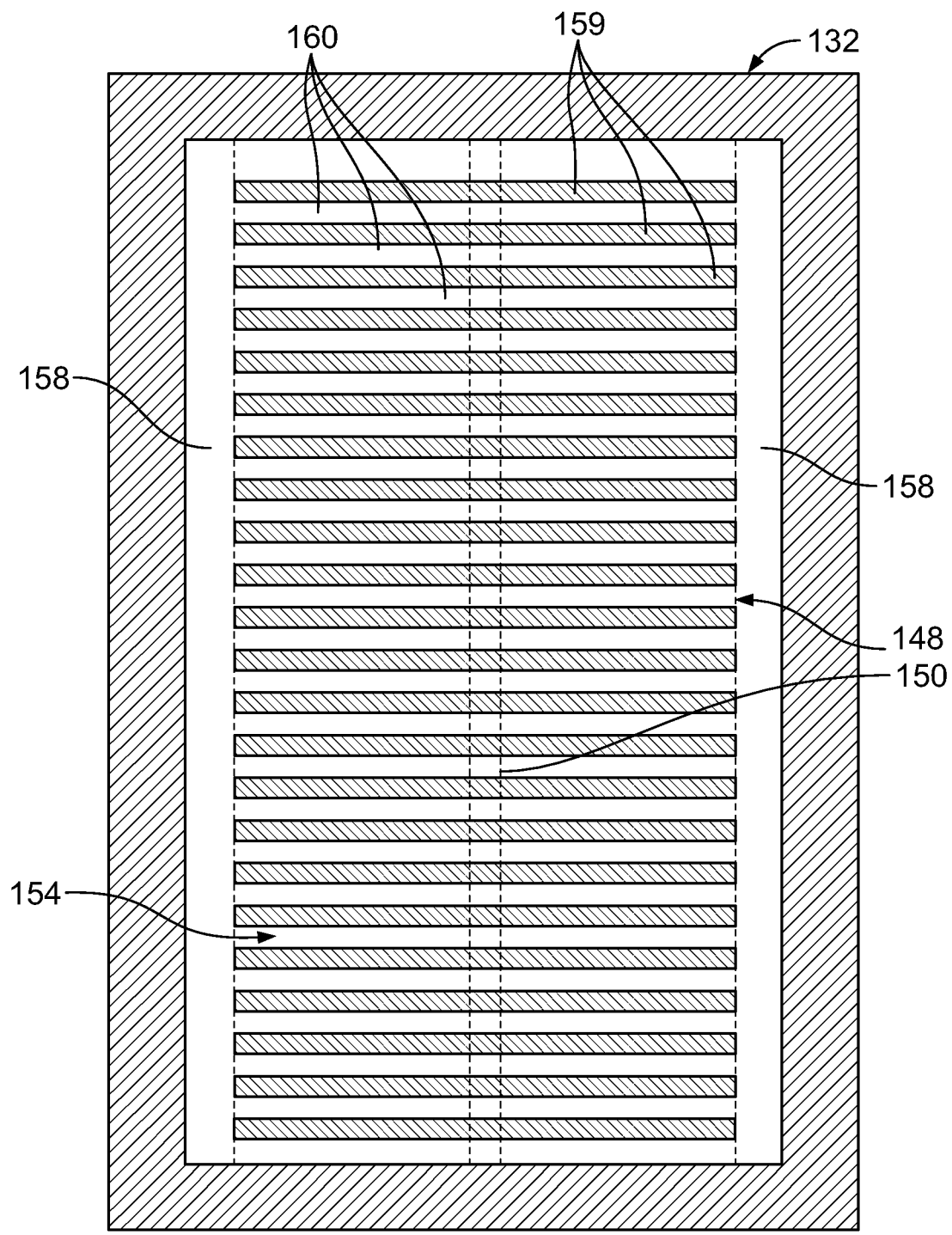

As shown more fully with reference to FIGS. 3A-3C, the thermosiphon system 130 includes a flow-boiling evaporator 132 (or evaporators 132) rather than a pool boiling evaporator. In the example flow-boiling evaporator 132, the liquid working fluid that enters the evaporator 132 boils as it flows through the evaporator 132 as the liquid absorbs heat from electronic device 124 (or devices 124). In comparison, in a pool boiling evaporator, the liquid phase of the working fluid "pools" in the evaporator (e.g., at the lowest elevation) and slowly boils off, with vapor from the liquid phase rising above the pool of liquid working fluid. As the liquid phase of the working fluid boils, a vapor phase of the working fluid is formed, thereby decreasing a density of the working fluid as it flows in the evaporator. The decreased density of the working fluid may increase a velocity of the flowing working fluid through the evaporator 132, thereby further causing the liquid phase to flow through the evaporator 132. This increased velocity may result in increased convective heat transfer in the evaporator 132 and, consequently a more efficient heat transfer process between the electronic devices 124 and the working fluid in the evaporator 132.

In some aspects, a pressure drop through the thermosiphon system 130 is balanced (e.g., substantially or exactly). A "pumping force" to circulate a flow of the working fluid through the thermosiphon system 130 may be provided by a liquid head (e.g., an amount of liquid phase of the working fluid built up in the condenser 134). This liquid head pressure may be equal (e.g., substantially or equally) to a sum of all pressure drops through the system 130. The pressure drops include, for example, a pressure drop of the liquid phase from the condenser 134 to the evaporator 132 through the transport member 136, a pressure drop as the liquid phase flow-boils to the vapor (or mixed) phase in the evaporator 132, and a pressure drop of the vapor (or mixed) phase flowing through the transport member 136 from the evaporator 132 to the condenser 134. In some aspects, to ensure proper flow of the working fluid in a natural flow system (e.g., without mechanical pumping), the total pressure drop is equal or substantially equal to the liquid head available in the system 130.

In some aspects of the presently described implementations, a vapor conduit that extends through transport member 136 of thermosiphon system 130 may be larger (e.g., in cross-sectional area) than a liquid conduit that extends through the transport member 136. For example, by having a larger (e.g., cross-section) vapor conduit, proper flow of the working fluid may be assisted or achieved because, for instance, the vapor (or mixed) phase of the working fluid is less dense that the liquid phase. Thus, in order to reduce pressure losses associated with circulating (e.g., naturally) the vapor (or mixed) phase through the vapor conduit, as compared to pressure losses associated with circulating (e.g., naturally) the liquid phase through the liquid conduit, the vapor conduit flow area may be larger. In some aspects, the vapor conduit flow area may be a sum of flow areas of two or more vapor conduits that extend through the transport member 136.

FIGS. 3A-3C illustrate schematic cross-sectional side, isometric, and top views, respectively, of an evaporator of an example implementation of a thermosiphon cooling system, such as the thermosiphon cooling system 130 shown in FIGS. 2A-2B. As illustrated in the side cross-section of FIG. 3A, an evaporator end 140 of the transport member 136 is mounted on the evaporator 132. In this implementation of the transport member 136, the member 136 includes a single liquid conduit 144 and two vapor conduits 146.

As shown, the liquid conduit 144 includes outlet 150 and extends (e.g., in a "cross" shaped cross-section) through a middle portion of the transport member 136 and above a heat transfer surface 148 of the evaporator 132. The heat transfer surface 148, in this implementation, is positioned over a fluid channel 154 of the evaporator 132 that is parallel (e.g., exactly or substantially) to the liquid conduit 144. Also, the heat transfer surface 148, in this example, includes multiple fins 159 that form fluid pathways 160 across the evaporator 132 (e.g., transverse to the liquid conduit 144) within the fluid channel 154. In some aspects, fins 159 may be formed to at or about 4 millimeters (mm) above the fluid channel 154 and at 16-40 fins per inch (fpi) across the fluid channel 154. Other extended surfaces, such as rounded or sharp ridges, may also be used as the heat transfer surface 148.

In this example embodiment, the transport member 136 forms a top surface 149 of the fluid pathways 160, thereby capping the fluid pathways 160 so that the working fluid vapor phase 156 is constrained within the fluid pathways 160 until the vapor phase 156 flows into the troughs 158. In alternative implementations, a separate member (e.g., a flat sheet or other member) may be used to vertically enclose or cap the fluid pathways 160 at a top of the pathways 160.

In this example implementation shown in FIGS. 3A-3C, there are two vapor conduits 146 with inlets 143, shown on opposed sides of the transport member 136. In this example, each vapor conduit 146 is substantially "L"-shape with an extended portion towards the middle of the transport member 136 and a stub portion that is positioned over a trough 158 of the evaporator 132.

FIG. 3C illustrates a top cross-section view of the evaporator 132. As illustrated, the fluid channel 154 extends through the evaporator 132 and, in this implementation, is transverse to the fluid pathways 160 that are formed between the fins 159. As shown in dotted line here, the outlet 150 of the transport member 136 extends parallel to the fluid channel 154 (and transverse to the fluid pathways 160) and through a center of the channel 154. The troughs 158 are also illustrated by dotted lines extending parallel to the outlet 150 and on opposed sides of the fluid channel 154.

Figure 5A:
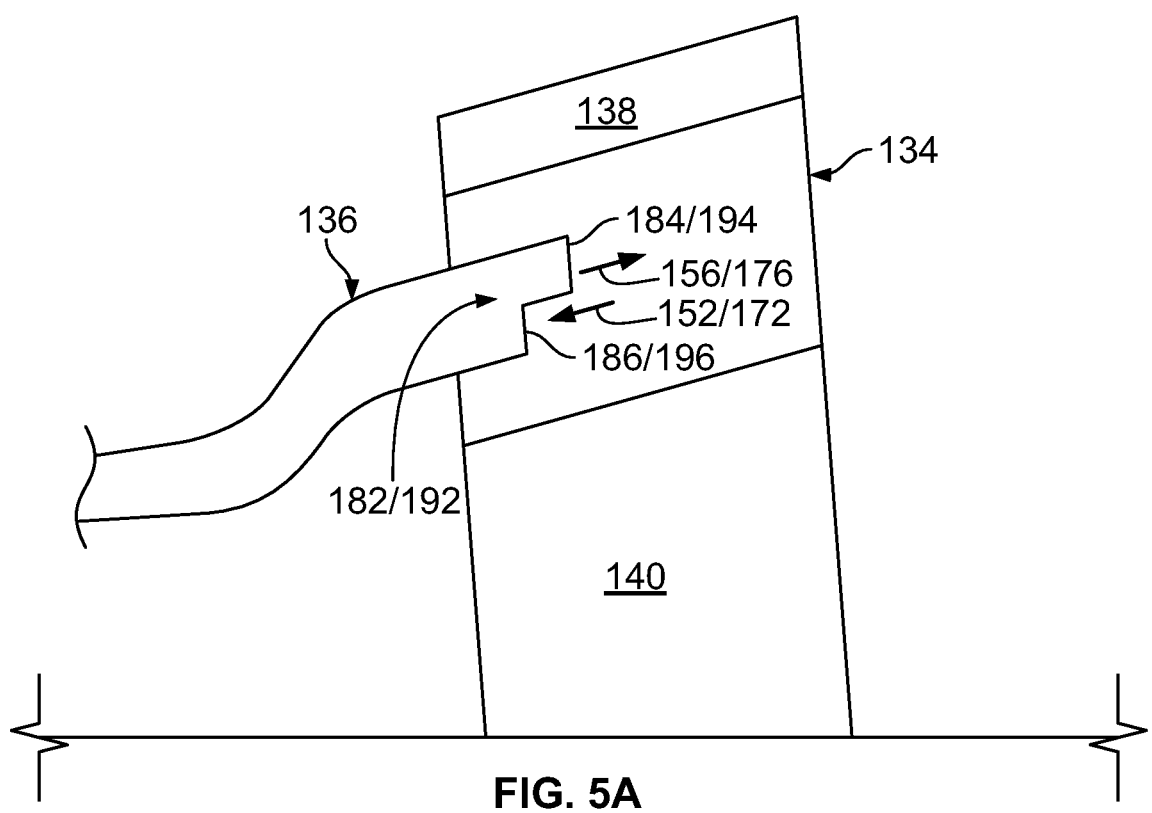
FIGS. 5A-5C illustrate schematic side and isometric views of a condenser of example implementations of a thermosiphon cooling system.
Figure 5B:
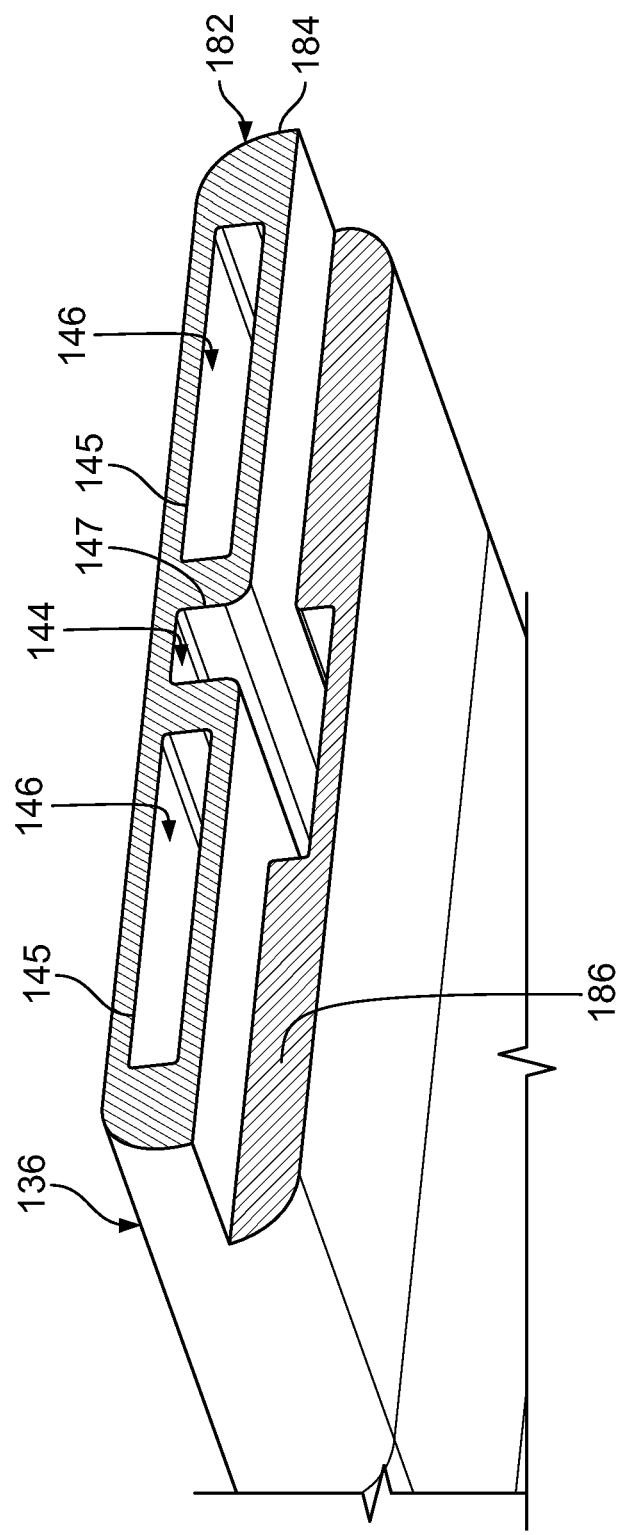

Turning briefly to FIG. 5B, a schematic isometric view of a condenser end 182 of the transport member 136 is illustrated. In some example implementations, the condenser end 182 may correspond with the evaporator end 142 of the transport member 136, in that two outlets 145 of the vapor conduits 146 are shown exiting the condenser end 182, with a single liquid conduit 144 having a liquid entrance 147 in the condenser end 182. As illustrated in FIG. 5B, the condenser end 182 includes an extended portion 184, which includes the outlets 145 of the vapor conduits 146 and a portion of the inlet 147 of the liquid conduit 144. The condenser end 182 also includes a recessed portion 186 that includes a portion of the entrance 147 of the liquid conduit 144. The recessed portion 186, as a solid portion of the transport member 136, extends length-wise through the transport member 136 to force a flow of working fluid vapor to circulate (e.g., naturally) through the extended portions of the L-shaped vapor conduits 146 that extend the entire length of the transport member 136 (and exit as shown in FIG. 5B at the condenser end 182).

In some aspects, the inlets and outlets of the liquid conduit 144 or the vapor conduit 164, or both, may be adjustable (e.g., as manufactured) so that a pressure loss of the working fluid that circulates through the transport member 136, the evaporator 132, and the condenser 134 may be more particularly matched to a required thermal load (e.g., to match a heat output of the heat generating electronic devices 124. For example, adjusting the inlets, the outlets, or both, may adjust a total pressure loss of the working fluid as it circulates through the thermosiphon system 130, which may adjust a cooling capacity of the working fluid.

In operation, a liquid phase 152 of a working fluid of the thermosiphon cooling system flows (e.g., naturally) through the liquid conduit 144 in the transport member 136 towards the evaporator 132. As the liquid phase 152 reaches the evaporator 132 positioned below the transport member 136, the liquid phase 152 flows through an outlet 150 of the liquid conduit 144 and into the fluid channel 154. As the heat transfer surface 148 is divided into the fluid pathways 160 (e.g., by the fins 159), the liquid phase 152 flows into the fluid pathways 160 from the outlet 150.

In the fluid pathways 160, the liquid phase 152 receives heat from one or more heat generating devices (not shown) thermally coupled to the evaporator 132. As the heat is received, the liquid phase 152 begins to boil, e.g., change phase from liquid to a mixed-phase or vapor phase of the working fluid. As described previously, as the liquid phase 152 changes to a vapor phase (or mixed phase) 156 in the fluid pathways 160, a density of the working fluid decreases, thereby increasing a flow velocity of the working fluid in the fluid pathways 160 (which in turn increases heat transfer to the working fluid in the fluid pathways 160). Further, in some example implementations, the fluid pathways 160 may be pitched away from the outlet 150 and towards the troughs 158.

The working fluid that is vertically enclosed within the fluid pathways 160 by the top surface 149 and flows from the fluid pathways 160 into the troughs 158 is the vapor or mixed phase 156 (e.g., all or substantially all). In some examples, the thermosiphon system may be designed such that most of the liquid phase 152 is vaporized within the fluid channels 160, without running the thermosiphon "dry" (e.g., vaporizing all of the liquid phase 152) when the heat generating devices are operating at peak or nameplate heat output (e.g., peak or nameplate power, peak speed, or otherwise). As the vapor or mixed phase 156 collects in the troughs 158, natural circulation (e.g., density and/or pressure differences) causes this phase 156 to migrate to the vapor conduits 146, and to circulate back to the condenser end 182 of the thermosiphon system in the transport member 136.

During operation, in some example aspects of the transport member 136, heat may be transferred from the vapor (or mixed phase) 156 to the liquid phase 152 as the two phases flow through the transport member 136 (in opposite directions). For example, the transport member 136 may include a heat transfer interface 188 that extends a length of the transport member 136 between the liquid conduit 144 and the vapor conduits 146. The heat transfer interface 188 may be made of the same or similar material as the transport member 136 (e.g., copper, aluminum, or otherwise), or may be made of a material of higher thermal conductivity than the transport member 136. In any event, as the vapor (or mixed) phase 156 circulates (e.g., naturally) toward the condenser, heat may be transferred from the phase 156 to the liquid phase 152. By "pre-heating" the liquid phase 152 (e.g., heating the phase 152 prior to entering the fluid pathways 160), additional vaporization of the liquid phase 152 in the pathways 160 may be achieved.

Figure 4A:
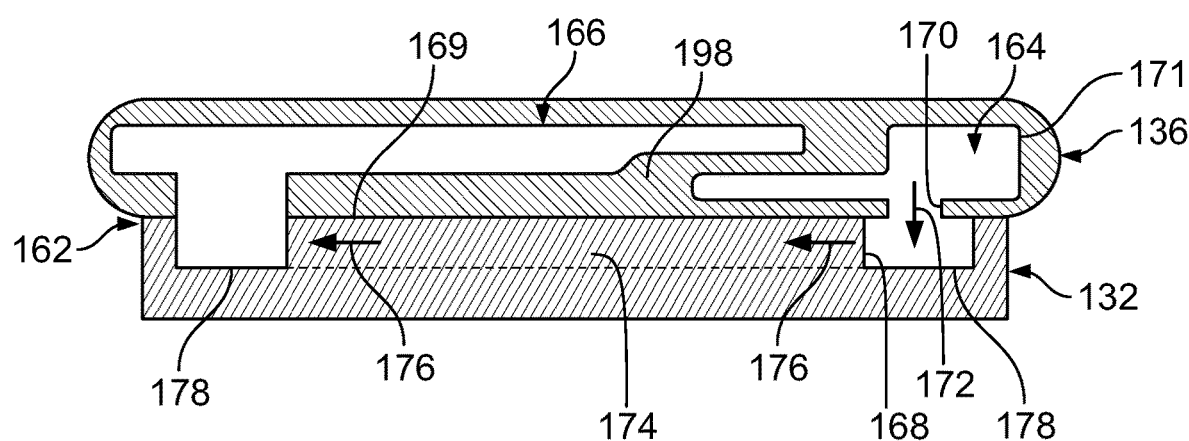
FIGS. 4A-4C illustrate schematic cross-sectional end, isometric, and top, respectively, of an evaporator of another example implementation of a thermosiphon cooling system.
Figure 4B:
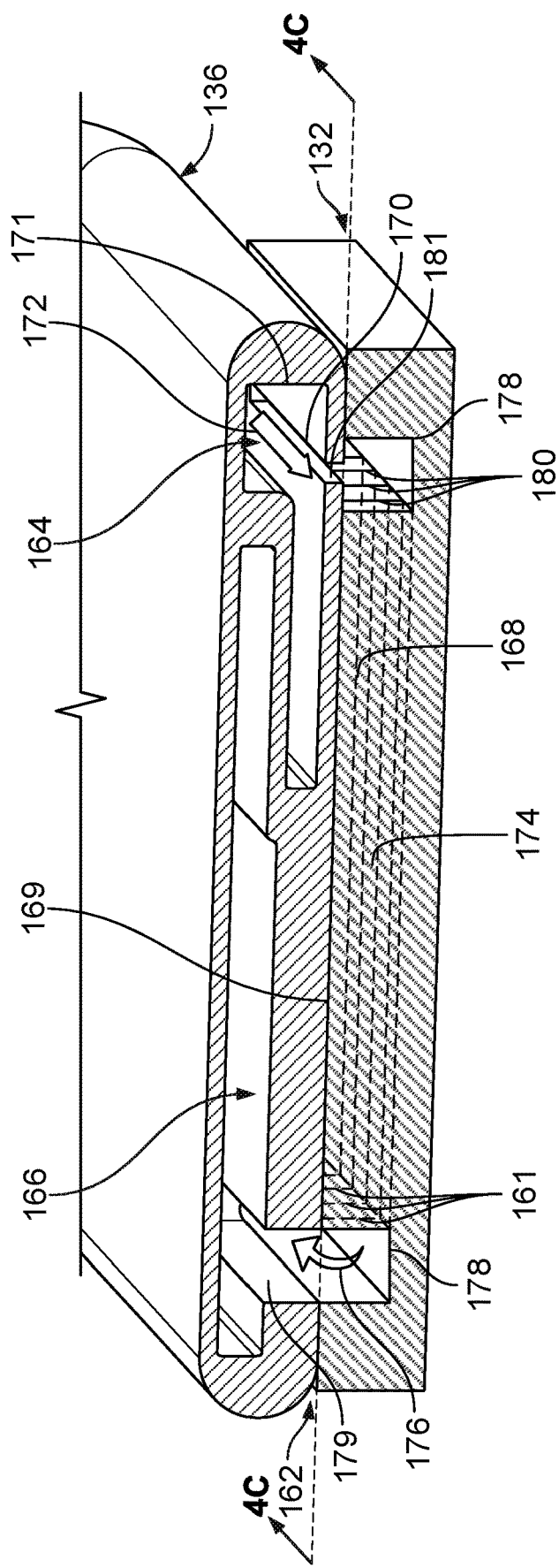
Figure 4C:
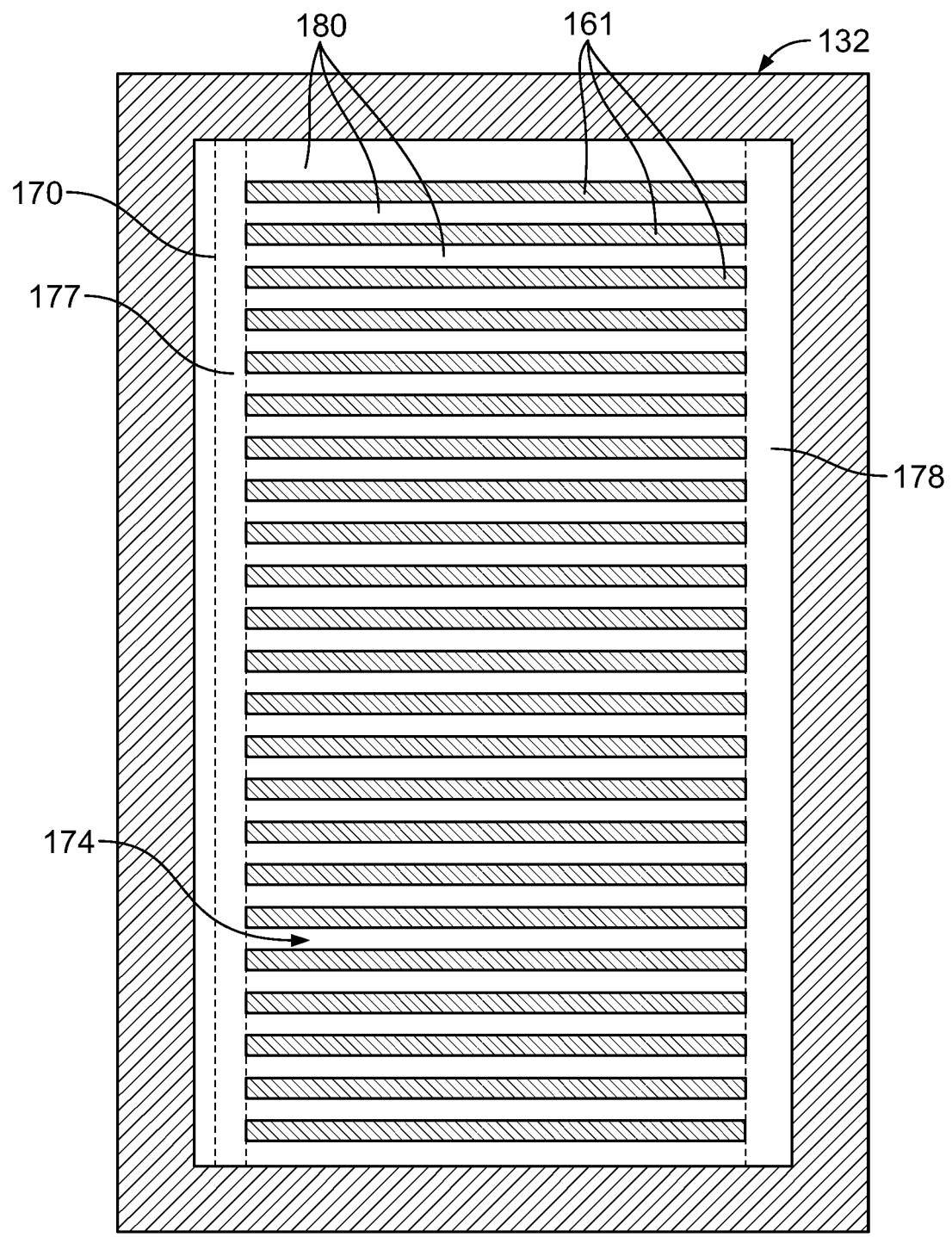

FIGS. 4A-4C illustrate schematic cross-sectional side, isometric, and top views, respectively, of an evaporator end of another example implementation of a thermosiphon cooling system, such as the thermosiphon cooling system 130 shown in FIGS. 2A-2B. As illustrated in the cross-section of FIG. 4A, an evaporator end 162 of the transport member 136 is mounted on the evaporator 132. In this implementation of the transport member 136, the member 136 includes a single liquid conduit 164 and a single vapor conduit 166. As shown, the liquid conduit 164 extends (e.g., in an "L" shaped cross-section) through a right side portion (in these views) of the transport member 136 and above a heat transfer surface 168 of the evaporator 132. The heat transfer surface 168, in this implementation, is positioned over a fluid channel 174 of the evaporator 132 that is parallel (e.g., exactly or substantially) to the liquid conduit 164. Also, the heat transfer surface 168, in this example, includes multiple fins 161 that form fluid pathways 180 across the evaporator 132 (e.g., transverse to the liquid conduit 164) within the fluid channel 174. In some aspects, fins 161 may be formed to at or about 4 mm above the fluid channel 174 and at 16-40 fins per inch (fpi) across the fluid channel 174. Other extended surfaces, such as rounded or sharp ridges, may also be used as the heat transfer surface 168. The liquid conduit 164 includes an elongated aperture or slot 181 at the respective inlets of the fluid pathways 180.

In this example embodiment, the transport member 136 forms a top surface 169 of the fluid pathways 180, thereby capping the fluid pathways 180 so that the working fluid vapor phase 176 is constrained within the fluid pathways 180 until the vapor phase 176 flows into the trough 178. In alternative implementations, a separate member (e.g., a flat sheet or other member) may be used to vertically enclose or cap the fluid pathways 180 at a top of the pathways 180.

In this example implementation shown in FIGS. 4A-4C, there is one vapor conduit 166, shown on an opposed left side (in these views) of the transport member 136 across from the liquid conduit 164. In this example, the vapor conduit 166 is an inverted "L"-shape with an extended portion towards the middle of the transport member 136 and a stub portion that is positioned over a trough 178 of the evaporator 132. The transport member 136 includes an elongated aperture or slot 179 at outlets of the fluid pathways 180.

FIG. 4C illustrates a top cross-section view of the evaporator 132. As illustrated, the fluid channel 174 extends through the evaporator 132 and, in this implementation, is also transverse to the fluid pathways 180 that are formed between the fins 161. As shown in dotted line here, the inlet trough 177 extends parallel to the fluid channel 174 (and transverse to the fluid pathways 180) and along a side of the channel 174. The outlet trough 178 is also illustrated by a dotted line extending parallel to the inlet trough 177 and on an opposed side of the fluid channel 174 relative to the inlet trough 177.

Figure 5C:
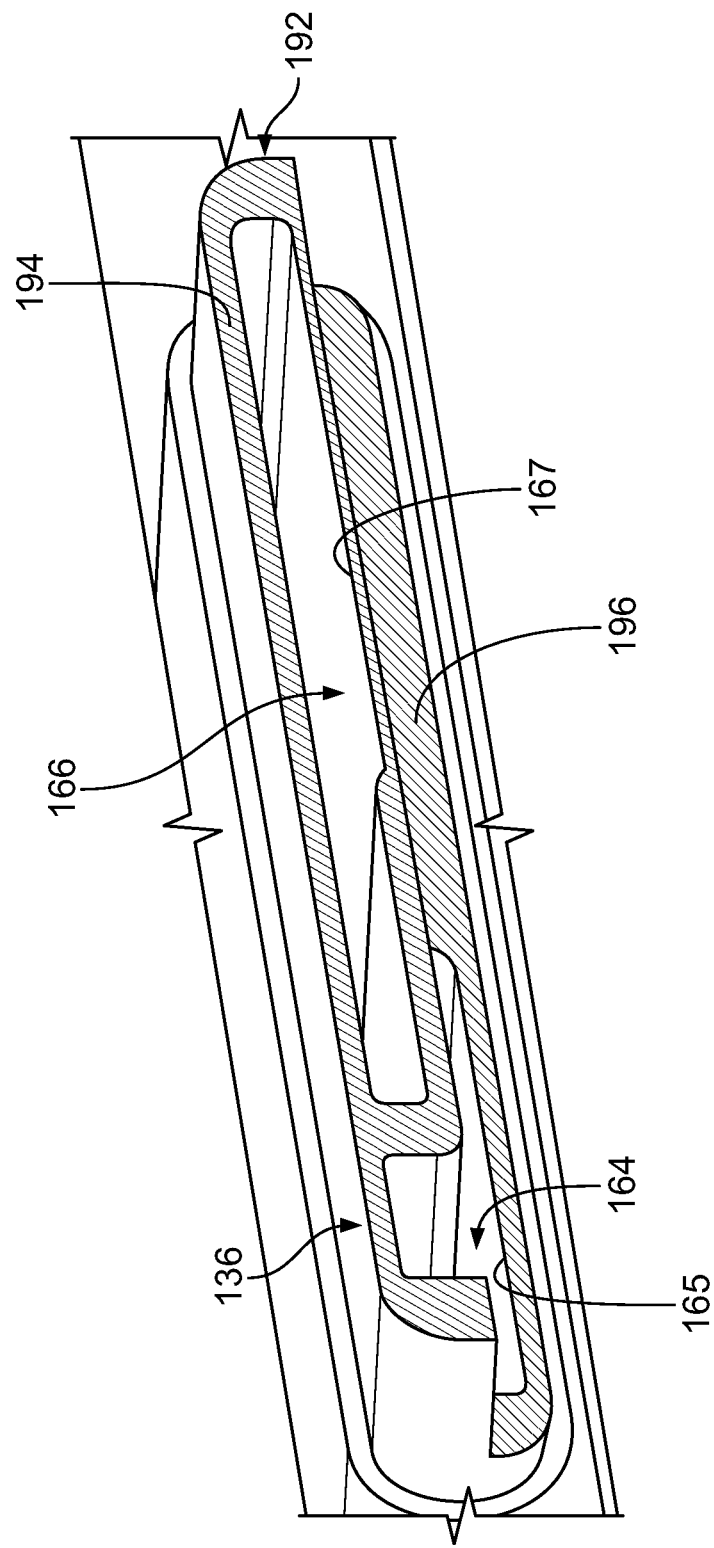

Turning briefly to FIG. 5C, a schematic isometric view of a condenser end 192 of the transport member 136 is illustrated. In some example implementations, the condenser end 192 may correspond with the evaporator end 162 of the transport member 136, in that one vapor conduit 166 is shown exiting the condenser end 192, with a single liquid conduit 164 having a liquid entrance in the condenser end 192. As illustrated in FIG. 5C, the condenser end 192 includes an extended portion 194, which includes the exit of the vapor conduit 166 and a portion of the entrance of the liquid conduit 164. The condenser end 192 also includes a recessed portion 196 that includes a portion of the entrance of the liquid conduit 164. The recessed portion 196, as a solid portion of the transport member 136 (underneath the vapor conduit 166), extends length-wise through the transport member 136 to force a flow of working fluid vapor to circulate (e.g., naturally) through the extended portion of the inverted L-shaped vapor conduit 166 that extends the entire length of the transport member 136 (and exits as shown in FIG. 5C at the condenser end 192).

In operation, a liquid phase 172 of a working fluid of the thermosiphon cooling system flows (e.g., naturally) through the liquid conduit 164 in the transport member 136 towards the evaporator 132. As the liquid phase 172 reaches the evaporator 132 positioned below the transport member 136, the liquid phase 172 flows through an outlet 170 of the liquid conduit 164, into an inlet trough 177, and into the fluid channel 174. As the heat transfer surface 168 is divided into the fluid pathways 180 (e.g., by the fins 161), the liquid phase 172 flows into the fluid pathways 180 from the outlet 170.

In the fluid pathways 180, the liquid phase 172 receives heat from one or more heat generating devices (not shown) thermally coupled to the evaporator 132. As the heat is received, the liquid phase 172 begins to boil, e.g., change phase from liquid to a mixed-phase or vapor phase of the working fluid. As described previously, as the liquid phase 172 changes to a vapor phase (or mixed phase) 176 in the fluid pathways 180, a density of the working fluid decreases, thereby increasing a flow velocity of the working fluid in the fluid pathways 180 (which in turn increases heat transfer to the working fluid in the fluid pathways 180). Further, in some example implementations, the fluid pathways 180 may be pitched away from the inlet trough 177 and towards the outlet trough 178.

The working fluid that flows from the fluid pathways 180 into the outlet trough 178 is the vapor or mixed phase 176 (e.g., all or substantially all). In some examples, the thermosiphon system may be designed such that most of the liquid phase 172 is vaporized within the fluid channels 180, without running the thermosiphon "dry" (e.g., vaporizing all of the liquid phase 172) when the heat generating devices are operating at peak or nameplate heat output (e.g., peak or nameplate power, peak speed, or otherwise). As the vapor or mixed phase 176 collects in the outlet trough 178, natural circulation (e.g., density and/or pressure differences) cause this phase 176 to migrate to the vapor conduit 166, and to circulate back to the condenser end 192 of the thermosiphon system in the transport member 136.

During operation, in some example aspects of the transport member 136, heat may be transferred from the vapor (or mixed phase) 176 to the liquid phase 172 as the two phases flow through the transport member 136 (in opposite directions). For example, the transport member 136 may include a heat transfer interface 198 that extends a length of the transport member 136 between the liquid conduit 164 and the vapor conduit 166. The heat transfer interface 198 may be made of the same or similar material as the transport member 136 (e.g., copper, aluminum, or otherwise), or may be made of a material of higher thermal conductivity than the transport member 136. In any event, as the vapor (or mixed) phase 176 circulates (e.g., naturally) toward the condenser, heat may be transferred from the phase 176 to the liquid phase 172. By "pre-heating" the liquid phase 172 (e.g., heating the phase 172 prior to entering the fluid pathways 180), additional vaporization of the liquid phase 172 in the pathways 180 may be achieved.

FIG. 5A illustrates a schematic side view of a condenser end of example implementations of a thermosiphon cooling system. FIG. 5A, as shown, illustrates a side view of either of condenser ends 182 or 192, as shown in FIG. 5B or 5C, respectively. This side view illustrates condenser ends 182 or 192 positioned within the condenser 134. Generally, the vapor (or mixed) phase of a working fluid that circulates out of the condenser ends 182/192 enters the condenser 134, is cooled, and condenser to a liquid phase of the working fluid. As shown, extended portions 184 and 194 of the condenser ends 182 and 192 provide outlets for the vapor (or mixed) phase 156 and 176.

Further, the recessed portions 186 and 196 of the condenser ends 182 and 192 provide at least part of inlets for the liquid phase 152 and 172. In some implementations, the inlets are offset in the condenser ends 182 and 192 so that liquid working fluid is directed (e.g., by gravity) towards the inlets.

In alternative embodiments, the fluid pathways 160 may be oriented parallel (e.g., exactly or substantially) to the fluid channel 154. Thus, in aspects that include the fins 159, the fins 159 (or ridges, for example) are oriented to form the fluid pathways 160 parallel to the fluid channel 154.

Figure 6A:
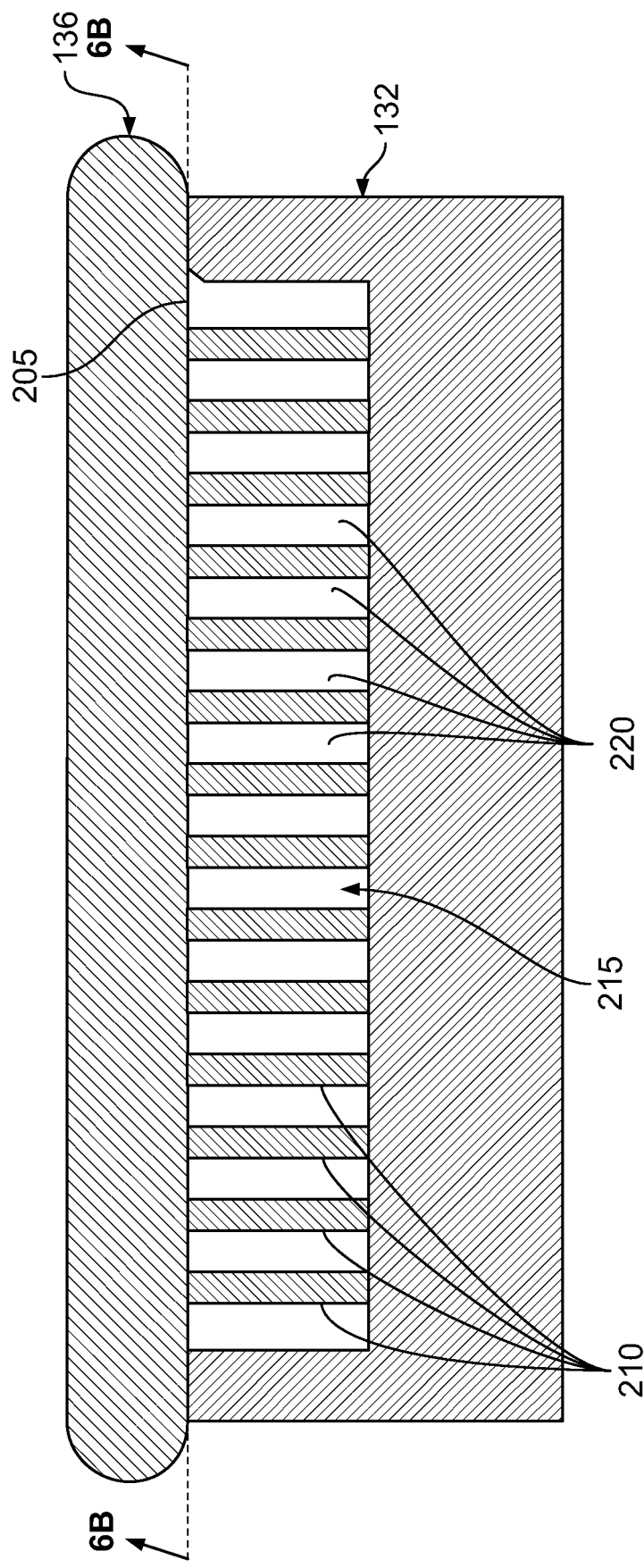
FIGS. 6A-6B illustrate schematic side and top cross-sectional views, respectively, of an evaporator of another example implementation of a thermosiphon cooling system.
Figure 6B:
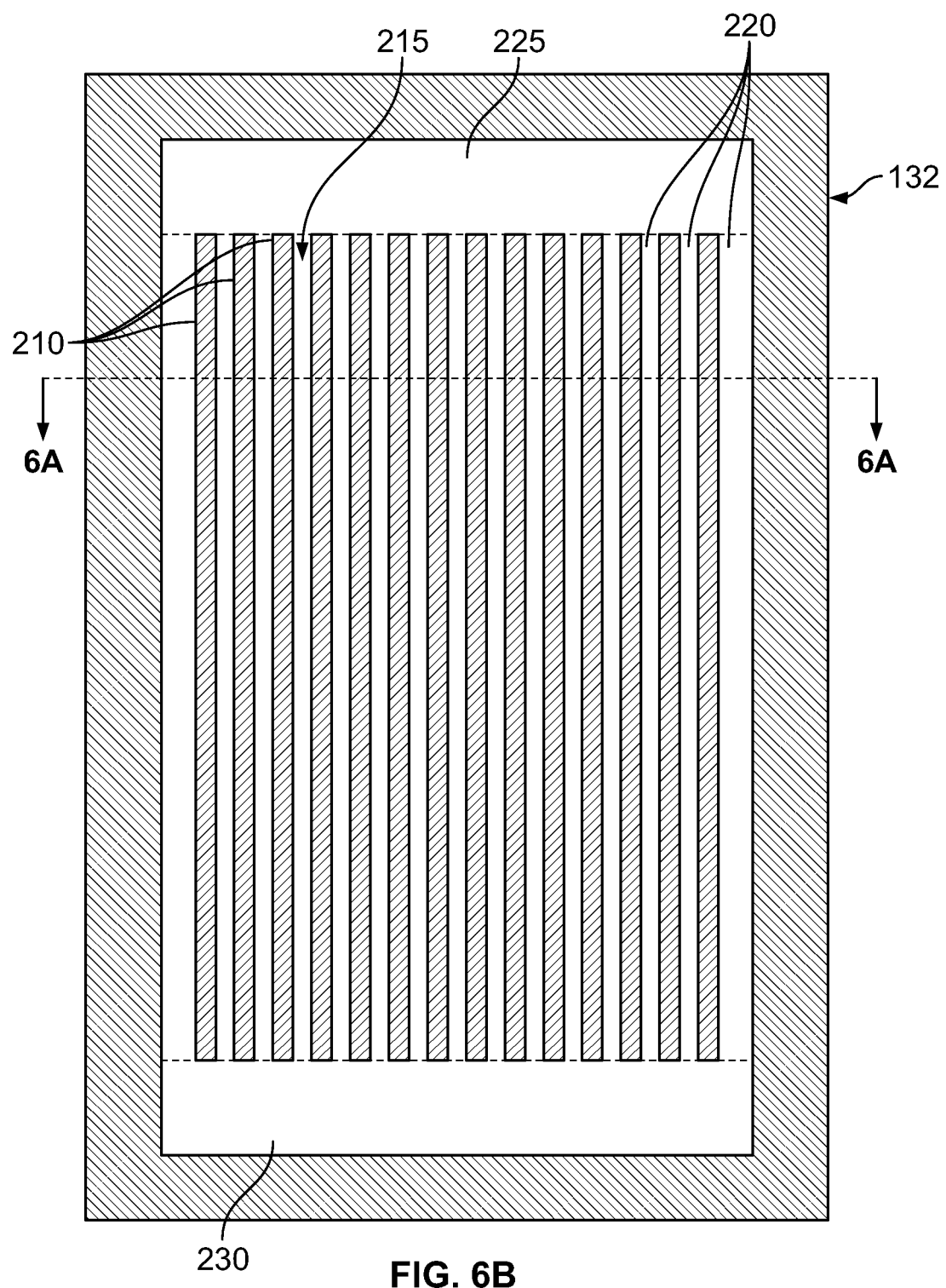

FIGS. 6A-6B illustrate schematic side and top cross-sectional views, respectively of an evaporator of another example implementation of a thermosiphon cooling system. For example, FIGS. 6A-6B show an evaporator 132 in which fluid pathways extend through the evaporator parallel with a fluid channel within the evaporator. Turning to FIG. 6A, The transport member 136 is illustrated on top of the evaporator 132 and forming a top surface 205 for fluid pathways 220. The fluid pathways 220 are formed between heat transfer surfaces 210 (e.g., fins or ridges) through a fluid channel 215 of the evaporator 132. FIG. 6B illustrates a top cross-section of the evaporator 132 shown in FIG. 6A. As illustrated, the heat transfer surfaces 210 extend through, and parallel with, the fluid channel 215 (relative to the longest dimension of the channel 215). The fluid pathways 220 also are formed to extend parallel with the longest dimension of the fluid channel 215.

In operation, liquid working fluid may flow into an inlet area 225 of the evaporator 132, and, due to heat transfer from one or more heat generating electronic devices thermally coupled with the evaporator, may phase change to a vapor or mixed-phase working fluid through the fluid pathways 220. As the fluid pathways 220 are enclosed by the top surface 205, the working fluid is constrained to flow through the fluid pathways 220 to an outlet area 230. The vapor or mixed-phase working fluid exits the evaporator 132, and into a vapor conduit of the transport member 136, from the outlet area 230.

Figure 6C:
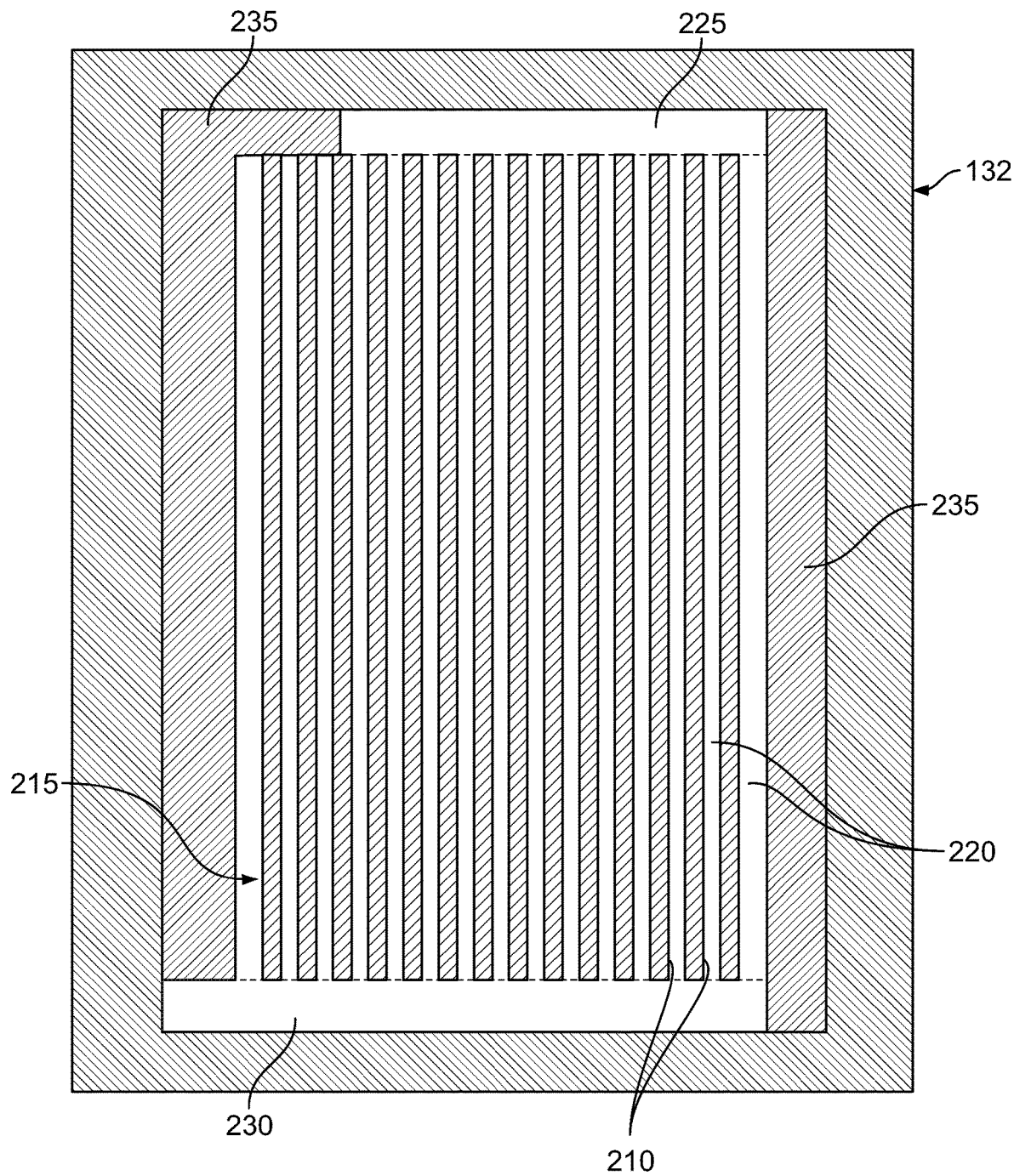
FIG. 6C illustrates a schematic top cross-sectional view of an evaporator of another example implementation of a thermosiphon cooling system.

FIG. 6C illustrates a top cross-section of another implementation of the evaporator 132 shown in FIG. 6A, which includes one or more spacers 235. In this implementation, the spacers 235 may be solid or mostly solid members that are inserted into the fluid channel 215 of the evaporator 132. The spacers 235 may be substantially the same depth of the fluid channel 215 and vertically extend up to the top surface 205. In some implementations, the spacers 235 may effectively decrease a heat transfer volume of the evaporator 132 (e.g., by decreasing a number or total volume of fluid pathways 220), thereby decreasing a total cooling power of the thermosiphon. Spacers 235, although illustrated in FIG. 6C as extending along sides of the fluid channel 215, may be any shape or size and may be tailored to effectively decrease any desired heat transfer volume. For example, spacers 235 may restrict the flow and balance a liquid flow rate of the working fluid through the evaporator 132. As noted, a thickness and size of the spacers 235 (or a single spacer 235) can be changed to adjust the flow rate based on the expected heat load. The spacer 235 or spacers 235 may also reduce or eliminate a need to have different cut out sizes for the liquid or vapor inlet/outlet in the transport member 126. As shown, spacers 235 are added on the two sides of the fins 210 to eliminate bypass flow around the fins 210 and guide all of the working fluid through the fluid pathways 220 between the fins 210. Thus, thermal performance may be tailored for a cooling power of the thermosiphon to a particular application (e.g., a particular heat output of one or more heat generating electronic devices).

A number of embodiments have been described. Nevertheless, it will be understood that various modifications may be made without departing from the spirit and scope of what is described. Further, in some implementations, a phase change material may be positioned, for example, between an evaporator of a thermosiphon and one or more heat generating electronic devices to increase a thermal contact area between the evaporator and the devices. As another example, in some implementations a heat transfer surface of an evaporator of a thermosiphon may not include fins or ridges. Accordingly, other embodiments are within the scope of the following claims.

What is claimed is:

1. A method for cooling heat generating electronic devices in a data center, comprising:
   flowing a liquid phase of a working fluid from a condenser of a thermosiphon to an evaporator of the thermosiphon in a transport member of the thermosiphon;
   flowing the liquid phase of the working fluid into a fluid channel of the evaporator from the transport member;
   flowing the liquid phase of the working fluid from the fluid channel to a plurality of fluid pathways that extend through the fluid channel and are enclosed between the evaporator and the transport member;
   boiling at least a portion of the liquid working fluid flowing in the plurality of fluid pathways between inlets of the fluid pathways and outlets of the fluid pathways based on a transfer of heat from at least one data center heat generating device that is thermally coupled to the evaporator;
   flowing a mixed phase of the working fluid out of the plurality of fluid pathways into two opposite vapor conduits of the transport member and to the condenser, wherein the inlets of the fluid pathways are positioned at a midpoint of the fluid pathways, and the outlets of the fluid pathways are positioned at opposite ends of the fluid pathways; and transferring heat from the working fluid in the opposite vapor conduits to the working fluid in a liquid conduit through a heat transfer interface between the liquid conduit and at least one of the two opposite vapor conduits in the transport member, wherein the liquid conduit extends through the transport member and comprises a central, elongated slot at the inlets of the plurality of fluid pathways, and flowing the liquid phase of the working fluid into the fluid channel comprises flowing the liquid phase of the working fluid into a portion of the fluid channel at the inlets of the plurality of fluid pathways.

2. The method of claim 1, further comprising:
transferring heat from the heat-generating electronic devices to the working fluid through a heat transfer surface that forms the plurality of fluid pathways; and
changing the working fluid from the liquid phase to the mixed-phase between the inlets of the fluid pathways and the outlets of the fluid pathways.

3. The method of claim 2, wherein flowing the mixed phase comprises flowing the mixed phase of the working fluid out of the plurality of fluid pathways into the two opposite vapor conduits of the transport member through respective elongated apertures of the transport member at the respective outlets of the fluid pathways.

4. The method of claim 3, wherein the liquid conduit extends through the transport member and comprises an elongated slot at the inlets of the plurality of fluid pathway, and flowing the liquid phase of the working fluid into the fluid channel comprises flowing the liquid phase of the working fluid into a portion of the fluid channel at the inlets of the plurality of fluid pathways.

5. The method of claim 2, further comprising flowing the working fluid through a plurality of fins or ridges positioned that form the plurality of fluid pathways in the fluid channel.

6. The method of claim 5, wherein flowing the working fluid through a plurality of fins or ridges that form the plurality of fluid pathways in the fluid channel comprises flowing the working fluid transversely from the fluid channel through the plurality of fluid pathways.

7. The method of claim 6, further comprising transferring heat from at least one of the opposite vapor conduits to the working fluid in a liquid conduit of the transfer member through a heat transfer interface between the liquid conduit and at least one of the two opposite vapor conduits in the transport member.

8. The method of claim 7, wherein the liquid phase is at a saturation temperature of the working fluid.

9. The method of claim 8, further comprising flowing the mixed phase of the working fluid through the opposite vapor conduits to the condenser.

10. The method of claim 9, further comprising transferring heat from the working fluid in the opposite vapor conduits to the working fluid in the liquid conduit through opposite heat transfer interfaces between, each heat transfer interface disposed between the liquid conduit and a respective one of the opposite vapor conduits in the transport member.

11. The method of claim 1, wherein the liquid phase is at a saturation temperature of the working fluid.

12. The method of claim 1, further comprising flowing the mixed phase of the working fluid through the at least one vapor conduit to the condenser.

13. The method of claim 1, wherein flowing a mixed phase of the working fluid out of the plurality of fluid pathways into at least one vapor conduit of the transport member and to the condenser comprises flowing a mixed phase of the working fluid out of the plurality of fluid pathways into two separate vapor conduits of the transport member and to the condenser.

14. The method of claim 1, further comprising:
flowing the mixed phase of the working fluid through the at least one vapor conduit that is positioned in an upper half of the transport member; and
flowing the liquid phase of the working fluid through a liquid conduit that is positioned in a lower half of the transport member.

15. The method of claim 1, wherein the transport member comprises a condenser end that comprises an inlet of a liquid conduit that is offset in the transport member relative to an outlet of the vapor conduit in the condenser end of the transport member.

16. The method of claim 15, wherein the transport member slopes from the condenser to the evaporator, and a magnitude of the slope defines, at least in part, a liquid head of the working fluid.

17. The method of claim 1, wherein the transport member slopes from the condenser to the evaporator, and a magnitude of the slope defines, at least in part, a liquid head of the working fluid.

18. The method of claim 17, wherein the liquid head of the working fluid is equal to a sum of a plurality of pressure losses in a closed loop fluid circuit that comprises a liquid conduit, the evaporator, the vapor conduit, and the condenser.

19. A method for cooling heat generating electronic devices in a data center, comprising:
flowing a liquid phase of a working fluid from a condenser of a thermosiphon to an evaporator of the thermosiphon in a transport member of the thermosiphon;
flowing the liquid phase of the working fluid into a fluid channel of the evaporator from the transport member;
flowing the liquid phase of the working fluid from the fluid channel to a plurality of fluid pathways that extend through the fluid channel and are enclosed between the evaporator and the transport member;
boiling at least a portion of the liquid working fluid flowing in the plurality of fluid pathways between inlets of the fluid pathways and outlets of the fluid pathways based on a transfer of heat from at least one data center heat generating device that is thermally coupled to the evaporator; and
flowing a mixed phase of the working fluid out of the plurality of fluid pathways into two opposite vapor conduits of the transport member and to the condenser, wherein the inlets of the fluid pathways are positioned at a midpoint of the fluid pathways, and the outlets of the fluid pathways are positioned at opposite ends of the fluid pathways;
transferring heat from the heat-generating electronic devices to the working fluid through a heat transfer surface that forms the plurality of fluid pathways; and
changing the working fluid from the liquid phase to the mixed-phase between the inlets of the fluid pathways and the outlets of the fluid pathways, wherein
flowing the mixed phase comprises flowing the mixed phase of the working fluid out of the plurality of fluid pathways into the two opposite vapor conduits of the transport member through respective elongated apertures of the transport member at the respective outlets of the fluid pathways, and the liquid conduit extends through the transport member and comprises an elongated slot at the inlets of the plurality of fluid pathway, and flowing the liquid phase of the working fluid into the fluid channel comprises flowing the liquid phase of the working fluid into a portion of the fluid channel at the inlets of the plurality of fluid pathways.

20. The method of claim 19, further comprising flowing the working fluid through a plurality of fins or ridges positioned that form the plurality of fluid pathways in the fluid channel.

21. The method of claim 20, wherein flowing the working fluid through a plurality of fins or ridges that form the plurality of fluid pathways in the fluid channel comprises flowing the working fluid transversely from the fluid channel through the plurality of fluid pathways.

22. The method of claim 21, further comprising transferring heat from at least one of the opposite vapor conduits to the working fluid in a liquid conduit of the transfer member through a heat transfer interface between the liquid conduit and at least one of the two opposite vapor conduits in the transport member.

23. The method of claim 22, wherein the liquid phase is at or near a saturation temperature of the working fluid.

24. The method of claim 19, further comprising flowing the mixed phase of the working fluid through the opposite vapor conduits to the condenser.

25. The method of claim 24, further comprising transferring heat from the working fluid in the opposite vapor conduits to the working fluid in the liquid conduit through opposite heat transfer interfaces between, each heat transfer interface disposed between the liquid conduit and a respective one of the opposite vapor conduits in the transport member.

26. The method of claim 19, wherein the liquid phase is at or near a saturation temperature of the working fluid.

27. The method of claim 19, further comprising flowing the mixed phase of the working fluid through the at least one vapor conduit to the condenser.

28. The method of claim 19, wherein flowing a mixed phase of the working fluid out of the plurality of fluid pathways into at least one vapor conduit of the transport member and to the condenser comprises flowing a mixed phase of the working fluid out of the plurality of fluid pathways into two separate vapor conduits of the transport member and to the condenser.

29. The method of claim 19, further comprising:
flowing the mixed phase of the working fluid through the at least one vapor conduit that is positioned in an upper half of the transport member; and
flowing the liquid phase of the working fluid through a liquid conduit that is positioned in a lower half of the transport member.

30. The method of claim 19, wherein the transport member comprises a condenser end that comprises an inlet of a liquid conduit that is offset in the transport member relative to an outlet of the vapor conduit in the condenser end of the transport member.

31. The method of claim 30, wherein the transport member slopes from the condenser to the evaporator, and a magnitude of the slope defines, at least in part, a liquid head of the working fluid.

32. The method of claim 19, wherein the transport member slopes from the condenser to the evaporator, and a magnitude of the slope defines, at least in part, a liquid head of the working fluid.

33. The method of claim 32, wherein the liquid head of the working fluid is equal to a sum of a plurality of pressure losses in a closed loop fluid circuit that comprises a liquid conduit, the evaporator, the vapor conduit, and the condenser.

* * * * *